(12) United States Patent
Park et al.

(10) Patent No.: US 12,007,634 B2
(45) Date of Patent: Jun. 11, 2024

(54) DISPLAY DEVICE AND MANUFACTURING METHOD THEREFOR

(71) Applicant: TOVIS CO. LTD., Incheon (KR)

(72) Inventors: Yong Min Park, Gyeonggi-do (KR); In Suk Lee, Incheon (KR); Won Gyu Lee, Gyeonggi-do (KR); Eun Sung Kim, Incheon (KR)

(73) Assignee: TOVIS CO., LTD., Incheon (KR)

( * ) Notice: Subject to any disclaimer, the term of this patent is extended or adjusted under 35 U.S.C. 154(b) by 133 days.

(21) Appl. No.: 17/633,185

(22) PCT Filed: Aug. 4, 2020

(86) PCT No.: PCT/KR2020/010251
§ 371 (c)(1),
(2) Date: Feb. 4, 2022

(87) PCT Pub. No.: WO2021/025422
PCT Pub. Date: Feb. 11, 2021

(65) Prior Publication Data
US 2022/0276526 A1 Sep. 1, 2022

(30) Foreign Application Priority Data
Aug. 6, 2019 (KR) .................. 10-2019-0095301

(51) Int. Cl.
*G02F 1/1333* (2006.01)
(52) U.S. Cl.
CPC .............................. *G02F 1/133308* (2013.01)
(58) Field of Classification Search
CPC .............................................. G02F 1/133308
(Continued)

(56) References Cited

U.S. PATENT DOCUMENTS

2015/0301390 A1 10/2015 Kim

FOREIGN PATENT DOCUMENTS

KR 10-1478823 1/2015
KR 10-1610692 4/2016
(Continued)

OTHER PUBLICATIONS

International Search Report for PCT/KR2020/010251 dated Oct. 30, 2020 and its English translation from WIPO (now published as WO 2021/025422).
(Continued)

*Primary Examiner* — Alexander P Gross
*Assistant Examiner* — William D Peterson
(74) *Attorney, Agent, or Firm* — Ladas & Parry, LLP

(57) ABSTRACT

Provided are a display device and a fabrication method thereof. The display device includes a first substrate and a second substrate having one surface opposite to one surface of the first substrate. The first substrate includes a first-one portion that overlaps the second substrate in a thickness direction and a first-two portion that does not overlap the second substrate. The second substrate includes a second portion that overlaps the first substrate in the thickness direction. The first-two portion has a greater thickness than the first-one portion. The second portion includes a second-one portion that overlaps the first-one portion in the thickness direction and a second-two portion disposed between the second-one portion and the first-two portion in a plan view. The second-two portion has a greater thickness than the second-one portion. The second-two portion is disposed so as not to overlap the first-two portion in the thickness direction.

8 Claims, 17 Drawing Sheets

(58) Field of Classification Search
USPC .......................................................... 349/56
See application file for complete search history.

(56) References Cited

FOREIGN PATENT DOCUMENTS

| KR | 10-1676851 | 11/2016 |
| KR | 101676851 B1 * | 11/2016 |
| KR | 10-1955595 | 3/2019 |
| KR | 10-2026149 | 11/2019 |

OTHER PUBLICATIONS

Written Opinion of the International Searching Authority for PCT/KR2020/010251 dated Oct. 30, 2020 and its English translation by Google Translate (now published as WO 2021/025422).
Notice of Allowance for Korean Patent Application No. 10-2019-0095301 dated Dec. 21, 2020 and its English translation by Google Translate.

* cited by examiner

II−II'

III – III'

VII − VII'

VIII–VIII'

X-X'

DISPLAY DEVICE AND MANUFACTURING METHOD THEREFOR

CROSS-REFERENCE TO RELATED APPLICATIONS

The present application is the national stage of International Patent Application No. PCT/KR2020/010251 filed on Aug. 4, 2020, which claims the priority to Korean Patent Application No. 10-2019-0095301 filed in the Korean Intellectual Office on Aug. 6, 2019, the entire contents of which are incorporated herein by reference.

TECHNICAL FIELD

The present invention relates to a display device and a fabrication method thereof, and more particularly, to a curved display device having a curved display region and a fabrication method thereof.

BACKGROUND ART

A display device is an electronic device for displaying images, and along with the recent technological development, research on a curved display device is being conducted in order to increase image immersion.

A curved display device provides a sense of immersion because it gives the impression that a viewer is in a space by bending the side on which images are viewed, and a typical curved display device may be fabricated by thinning and bending the curved display device.

On the other hand, in order to fabricate a curved display device, the thickness of the display device may be designed and fabricated to be thin at the time of initial fabrication. If this is not the case, a curved display device may be fabricated by thinning, through a process as etching, and bending the display device.

DISCLOSURE

Technical Problem

An object of the present invention is to provide a display device with a small thickness deviation of a protruding region located on an edge of the display device.

Another object of the present invention is to provide a fabrication method of a display device with a small thickness deviation of a protruding region located on an edge of the display device.

The technical objects of the present invention are not limited to those described above, and other objects that are not described herein will be apparently understood by those skilled in the art from the following description.

Technical Solution

According to an example embodiment, a display device includes a first substrate and a second substrate having one surface opposite to one surface of the first substrate. The first substrate includes a first-one portion that overlaps the second substrate in a thickness direction and a first-two portion that does not overlap the second substrate. The second substrate includes a second portion that overlaps the first substrate in the thickness direction. The first-two portion has a greater thickness than the first-one portion. The second portion includes a second-one portion that overlaps the first-one portion in the thickness direction and a second-two portion disposed between the second-one portion and the first-two portion in a plan view. The second-two portion has a greater thickness than the second-one portion. The second-two portion is disposed so as not to overlap the first-two portion in the thickness direction.

The first-one portion may include a first-one-one portion and a first-one-two portion disposed between the first-one-one portion and the first-two portion, and the first-one-one portion may have a greater thickness than the first-one-two portion.

The second-one portion may include a second-one-one portion disposed to overlap the first-one-one portion in the thickness direction and a second-one-two portion disposed to overlap the first-one-two portion in the thickness direction, and the second-one-one portion may have a greater thickness than the second-one-two portion.

The first-one-one portion may have a smaller thickness than the first-two portion, and the second-one-one portion may have a smaller thickness than the second-two portion.

The first-one-two portion and the second-one-two portion may be multi-etched regions, the first-one-one portion and the first-one-two portion may be single-etched regions, and the first-two portion and the second-two portion may be non-etched regions.

The width of the first-one-one portion toward the first-one-two portion may be the same as the width of the second-one-one portion toward the second-one-two portion.

The width of the first-two portion toward the first-one portion may be smaller than the width of the second-two portion toward the first-one portion.

The first substrate and the second substrate may include curved surfaces obtained by bending the first-one portion and the second-one portion, respectively.

The display device may further include a driving connection film attached to the first-two portion of the first substrate.

The display device may further include a driving circuit board connected to the driving connection film.

According to another example embodiment, a fabrication method of a display device includes operations of preparing a flat display device including a first substrate member, a second substrate member having one surface opposite to one surface of the first substrate member, and a driving connection film attached to a part of the first substrate member protruding at one end farther than the second substrate member, asymmetrically masking, at one end, the other surface, which is opposite to the one surface of the first substrate member, and the other surface, which is opposite to the one surface of the second substrate member, and first etching the other surface of the first substrate member and the other surface of the second substrate member.

In the operation of asymmetrically masking, at one end, the other surface, which is opposite to the one surface of the first substrate member, and the other surface, which is opposite to the one surface of the second substrate member, the length of the masked surface of the first substrate member may be smaller than the length of the masked surface of the second substrate member.

After the operation of first etching the other surface of the first substrate member and the other surface of the second substrate member, the fabrication method may further include an operation of masking the other surface of the first substrate member and the other surface of the second substrate member at the other end facing the one end.

In the operation of masking the other surface of the first substrate member and the other surface of the second substrate member at the other end facing the one end, the length of the masked surface of the first substrate member may be the same as the length of the masked surface of the second substrate member.

Any other specific details of the embodiments are included in the detailed description and drawings.

Advantageous Effects

With the display device and the fabrication method thereof according to example embodiments, it is possible to minimize the thickness variation of a protruding region placed on an edge of the display device Effects according to the embodiments are not limited by the contents described above, and further various effects are included in the present disclosure.

MODES FOR CARRYING OUT THE INVENTION

Figure 1:
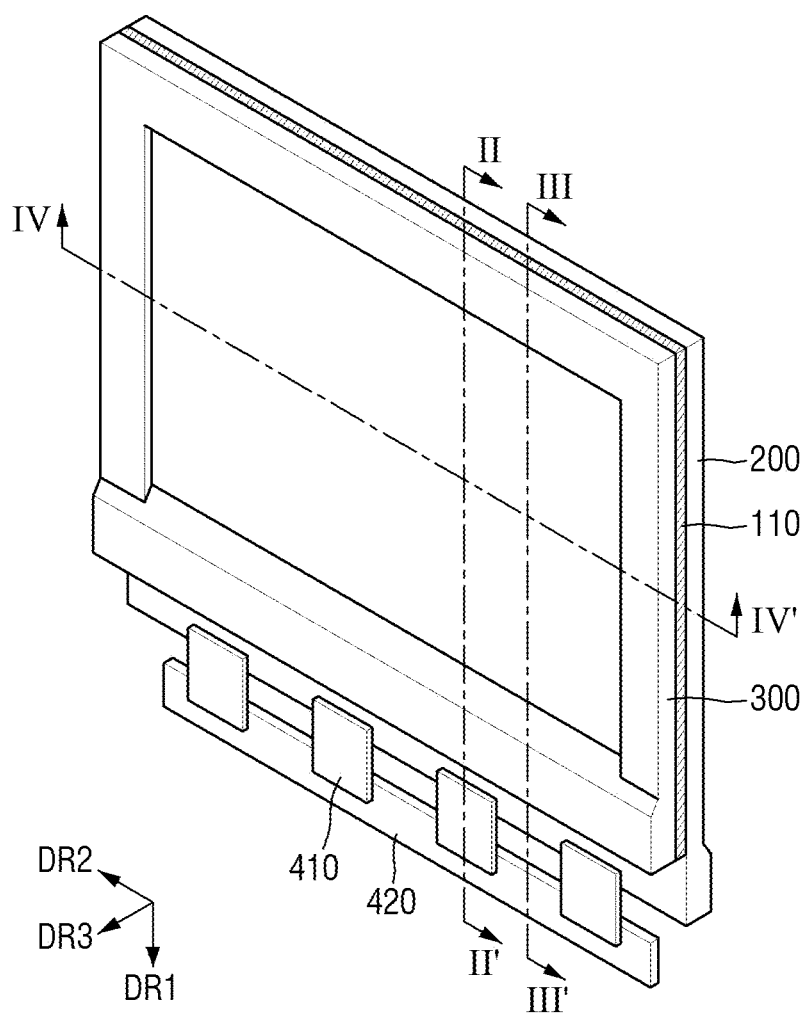
FIG. 1 is a perspective view schematically illustrating a display device according to an embodiment.

Advantages and features of the present invention and implementation methods thereof will be clarified through the following embodiments described in detail with reference to the accompanying drawings. However, the present invention is not limited to embodiments disclosed herein and may be implemented in various different forms. The embodiments are provided for making the disclosure of the prevention invention thorough and for fully conveying the scope of the present invention to those skilled in the art. It is to be noted that the scope of the present invention is defined by the claims.

Also, when it is mentioned that an element or layer is "on" another element or layer, the element or layer may be formed directly on the other element or layer, or a third element or layer may be interposed therebetween. Like reference numerals refer to like elements throughout.

It will be also understood that, although the terms first, second, etc. may be used herein to describe various elements, these elements should not be limited by these terms. These terms are only used to distinguish one element from another. Thus, a first element could be termed a second element without departing from the technical spirit of the present invention.

Hereinafter, embodiments will be described with reference to the accompanying drawings.

FIG. 1 is a perspective view schematically illustrating a display device according to an embodiment.

Referring to FIG. 1, when a display device is a device including a display region for displaying a picture or an image, the device may be interpreted as corresponding to the display device regardless of the main purpose, additional functions, or the name thereof. For example, the display device may include a small game machine, a large game machine such as a slot machine used in a casino, an electronic blackboard, an e-book, a smartphone, a mobile phone, a tablet PC, a personal digital assistant (PDA), a portable multimedia player (PMP), a television, a personal computer monitor, a notebook computer, a car navigation system, a car dashboard, a digital camera, a camcorder, an external billboard, an electric sign, various medical devices, various inspection devices, various home appliances including displays such as refrigerators and washing machines, and Internet of Things (IoT) devices, and the present invention is not limited to the above-described examples.

In an embodiment, the display device has a rectangular shape including two opposite long sides (an upper side and a lower side when the display surface is viewed in the drawing) and two opposite short sides (the left and right sides when the display surface is viewed in the drawing). As shown in FIG. 1, with respect to the normal direction of the display screen, the long sides of the display device may be arranged transversely as shown in FIG. 1, but the long sides of the display device may be arranged longitudinally.

In the drawing, three direction axes are defined. A first direction DR1 may be a short-side extension direction of the display device, a second direction DR2 may be a long-side extension direction of the display device, and a third direction DR3 may be a thickness direction of the display device.

The display device may have a curved shape. That is, the display surface of the display device may include a convex or concave curved surface. In an embodiment, as shown, the display device may include a curved surface that is bent in the second direction (DR2) side (along the long side in the drawing) and that is straight in the first direction (DR1) side (along the short side in the drawing). The DR2 side may be bent to be concave in the third direction DR3. That is, as shown, the curved surface of the display device may include a concave surface that is concavely curved in the display direction when the display surface is viewed. The curved display device may be formed by bending a flat panel display device.

The curvature of the curved portion in the display device may be constant. That is, the curved portion of the display device may be placed on a portion (arc) of a circle having a constant radius with respect to the center. The radius of curvature of the display device is not limited thereto but may be 0.5 m to 5 m or 1 m to 2 m.

A liquid crystal display (LCD) may be applied as the display device. In the following embodiments, a liquid crystal display is taken as an example of the display device, but the display device is not limited thereto. The present invention is applicable to an electrophoretic display (EPD), an organic light-emitting display (OLED), and a micro-light-emitting diode (micro-LED), a plasma display panel (PDP), a field-emission display (FED), a cathode-ray tube (CRT), and the like.

The display device may include a first substrate 200, a second substrate 300 opposite to the first substrate 200, and a liquid crystal layer 500 interposed between the first substrate 200 and the second substrate 300. A sealing member 110 is disposed on edges of the first substrate 200 and the second substrate 300 to couple the first substrate 200 and the second substrate 300 and prevent liquid crystal molecules of the liquid crystal layer 500 (FIG. 2) from leaking to the outside.

The first substrate 200 and the second substrate 300 of the display device may include curved surfaces having the same shape. That is, the display device may include the first substrate 200, which is curved, and the second substrate 300, which is curved.

One of the first substrate 200 and the second substrate 300 is a thin-film transistor substrate, and the other may be a color filter substrate. In this embodiment, as an example, the first substrate 200 is a thin-film transistor substrate, and the second substrate 300 is a color filter substrate. The display direction may be an outer direction of the top surface of the second substrate 300.

The first substrate 200, which is a thin-thin transistor substrate, may protrude farther than the second substrate 300. For example, one end of the first substrate 200 in the first direction DR1 may protrude farther than one end of the second substrate 300 in the first direction DR1. At least a portion of a driving unit for driving each pixel of the thin-film transistor substrate may be disposed on a portion where the first substrate 200 protrudes from and does not overlap the second substrate 300. For example, the driving unit may include a driving connection film 410 and a driving circuit board 420 connected to the driving connection film 410, and the driving connection film 410 may be attached to the non-overlapping portion of the first substrate 200. That is, the driving connection film 410 may not overlap the second substrate 300.

Although not shown, the display device may further include a polarizing film. The polarizing film may be attached to the rear surfaces of the first substrate 200 and the second substrate 300. The attachment region of the polarizing film may be in an etched region, which will be described below, but the present invention is not limited thereto.

The display device will be described in more detail below with reference to FIGS. 2 to 4.

Figure 2:
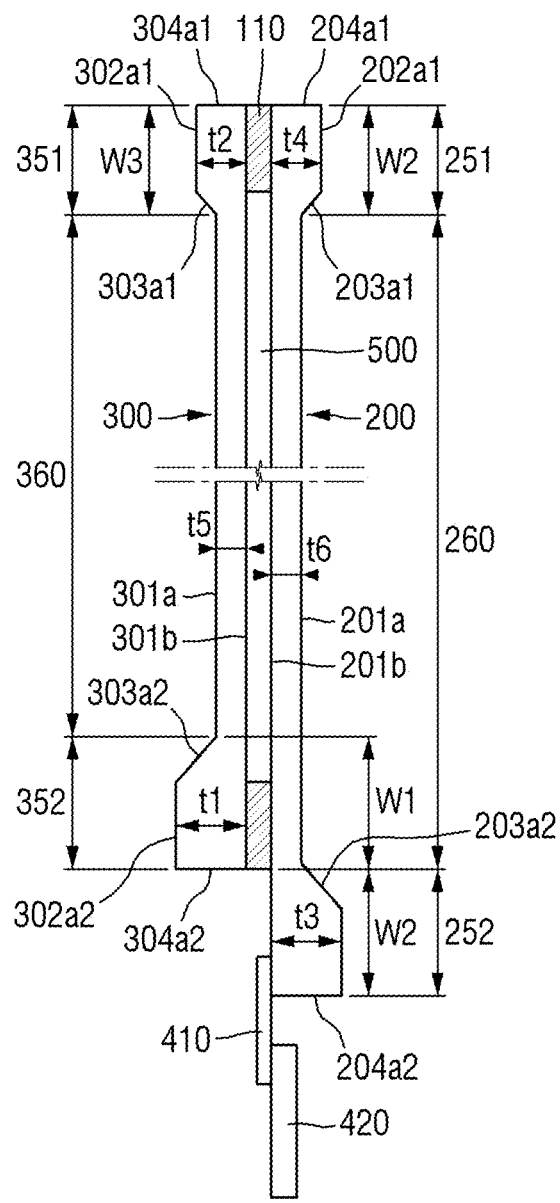
FIG. 2 is a cross-sectional view taken along line II-II' in the display device of FIG. 1.
Figure 3:
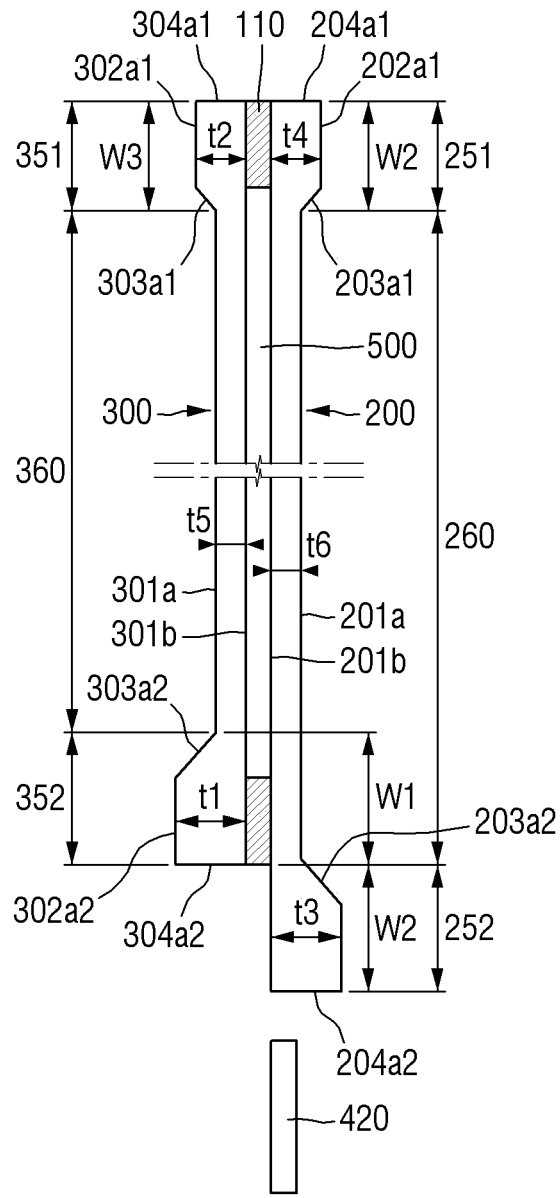
FIG. 3 is a cross-sectional view taken along line III-III' in the display device of FIG. 1.
Figure 4:
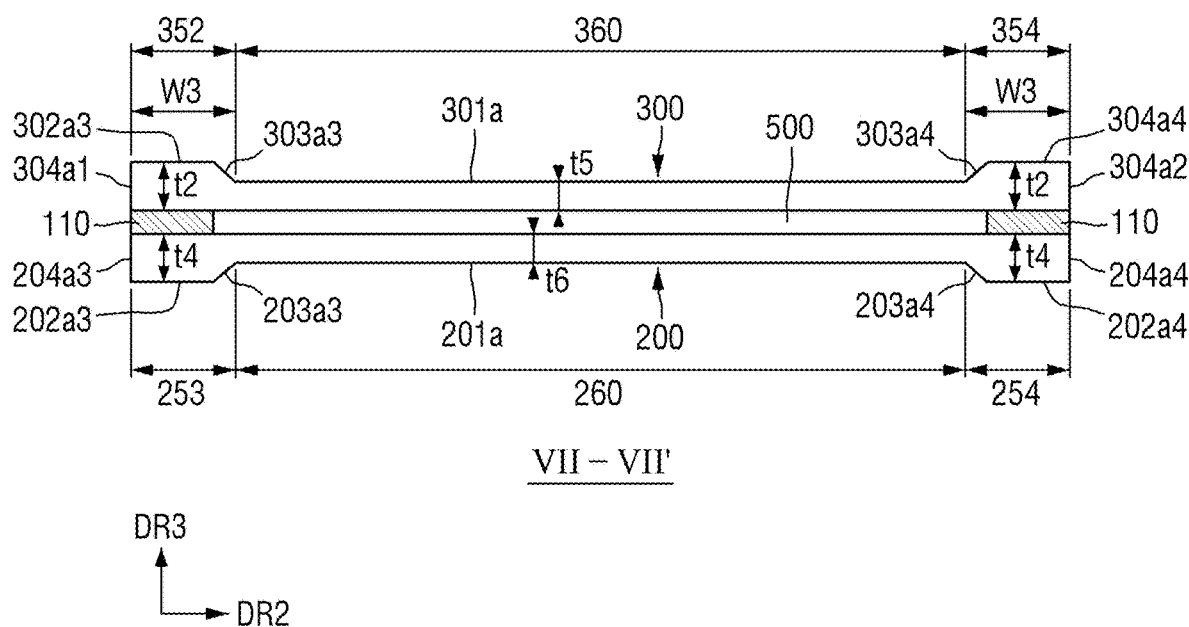
FIG. 4 is a cross-sectional view taken along line IV-IV' in the display device of FIG. 1.

FIG. 2 is a cross-sectional view taken along line II-II' in the display device of FIG. 1, FIG. 3 is a cross-sectional view taken along line III-III' in the display device of FIG. 1, and FIG. 4 is a cross-sectional view taken along line IV-IV' in the display device of FIG. 1.

Referring to FIGS. 1 to 3, each of the first substrate 200 and the second substrate 300 may include an insulating substrate made of glass, quartz, etc., and structures disposed thereon such as wiring, metal, a semiconductor layer, an insulating film, a color filter, and a black matrix. The structures may be disposed on one opposite surfaces 201b and 301b of the insulating substrate of the first substrate 200 and the insulating substrate of the second substrate 300. One surfaces 201b and 301b of the insulating substrate of the first substrate 200 and the insulating substrate of the second substrate 300 are flat, but the other surfaces (or rear surfaces) 201a and 301a, which are opposite surfaces, may include a region that protrudes or is recessed through etching. In the drawings, for convenience, the illustration of the structures disposed on the insulating substrate is omitted, and only the shapes of the insulating substrates of the first substrate 200 and the second substrate 300 are shown. Hereinafter, when referring to the rear shape of the first substrate 200 or the second substrate 300, the corresponding shape may refer to a rear shape of the insulating substrate of the first substrate 200 or a rear shape of the insulating substrate of the second substrate 300. However, the embodiment is not limited to the above example, and another additional layer is disposed on the rear surface of the insulating substrate of the first substrate 200 or the second substrate 300, and the corresponding layer is etched or polished to form a protruding or depressed region.

The driving connection film 410 is attached to one end of the first substrate 200 in the first direction DR1. The driving connection film 410 serves to connect the first substrate 200 and the driving circuit board 420. The driving connection film 410 may be attached to one surface 201 of the first substrate 200 with a first conductive anisotropic film 431 interposed therebetween. However, the present invention is not limited thereto, and the driving connection film 410 may be directly attached to one surface of the first substrate 200 through soldering or ultrasonic bonding. A region of the first substrate to which the driving connection film 410 is attached may be a region overlapping a first protruding region 212. The driving connection film 410, which is a film including a signal line, may include a flexible film. The driving connection film 410 may be a flexible printed circuit board (FPC), a tab, a connect film, or the like. The driving connection film 410 may be spaced apart from a first sealing material 120. That is, the driving connection film 410 may be located on one side in the first direction DR1 with respect to the first sealing material 120.

The driving circuit board 420 may be attached to one end of the driving connection film 410. The attachment between the driving connection film 410 and the driving circuit board 420 may be made by a second conductive anisotropic film 432 interposed therebetween. When soldering or ultrasonic bonding is used to couple the driving connection film 410 and the driving circuit board 420, the second conductive anisotropic film 432 may be omitted.

The driving circuit board 420 may be formed of a printed circuit board (PCB). A driving chip may be disposed on the driving circuit board 420. In some embodiments, the driving chip may be disposed on the driving connection film.

In the drawing, as an example, the driving circuit board 420 and the driving connection film 410 for connection of the driving circuit board 420 are disposed at one end of the first substrate 200 in the first direction DR1. However, the driving circuit board 420 and the driving connection film 410 may be disposed at the other end of the first substrate 200 in the first direction DR1 or may be disposed at one end or the other end of the first substrate 200 in the second direction DR2. Also, a plurality of driving circuit boards 420 and a plurality of driving connection films 410 are provided and attached adjacent to two or more sides of the first substrate 200.

In some embodiments, one driving circuit board 420 may be connected to the first substrate 200 by the plurality of driving connection films 410. That is, as shown in FIG. 1, the plurality of driving connection films 410, which has a smaller width than the driving circuit board 420, may be attached to the driving circuit board 420. The neighboring driving connection films 410 may be spaced apart from each other.

Each of the first substrate 200 and the second substrate 300 may include a first thickness region with a first thickness, a second thickness region with a second thickness greater than the first thickness, and a third thickness region with a third thickness greater than the second region. The first thickness region may be, but is not limited to, a region having a thickness reduced by the first etching and the second etching, and is hereinafter referred to as multi-etched regions 260 and 360. The second thickness region is a region that protrudes from the first thickness region, and is hereinafter referred to as single-etched regions 251, 253, 351, and 353. The third thickness region is a region that protrudes from the first thickness region and the third thickness region, and is hereinafter referred to as non-etched regions 252, 254, 352, and 354.

The display device includes a display region, which is located at the center, and a non-display region (or a bezel region) around the display region. The multi-etched regions 260 and 360 may overlap the display region, and the single-etched regions 251, 253, 351, and 353 and the non-etched regions 252, 254, 352, and 354 may overlap the non-display region. The multi-etched regions 260 and 360 may extend to a portion of the non-display region and further overlap the non-display region. On the other hand, the single-etched regions 251, 253, 351, and 353 and the non-etched regions 252, 254, 352, and 354 may not overlap the display region. The single-etched regions 251, 253, 351, and 353 and the non-etched regions 252, 254, 352, and 354 may be disposed on edges of the display device. The multi-etched regions 260 and 360 may be located between, and further surrounded by, the single-etched regions 251, 253, 351, and 353 and the non-etched regions 252, 254, 352, and 354.

More specifically, the first substrate 200 includes a first non-etched region 252 formed at one end in the first direction DR1 (the right ends in FIGS. 2 and 3) and first single-etched regions 251, 253, and 254 formed at the other end in the first direction DR1 (the left ends in FIGS. 2 and 3), one end in the second direction DR2 (the right end in FIG. 4), and the other end in the second direction DR2 (the left end in FIG. 4).

The second substrate 300 includes a second non-etched region 352 formed at one end in the first direction DR1 (the right ends in FIGS. 2 and 3) and second single-etched regions 351, 353, and 354 formed at the other end in the first direction DR1 (the left ends in FIGS. 2 and 3), one end in the second direction DR2 (the right end in FIG. 4), and the other end in the second direction DR2 (the left end in FIG. 4).

Here, the other side in the first direction DR1 refers to a side opposite to the one side in the first direction DR1, which is used below as the same meaning when describing one side and the other side in the other direction.

The non-etched regions 252 and 352 and the single-etched regions 251, 253, 254, 351, 353, and 354 may be formed to protect the driving connection film 410 or prevent damage to the first substrate 200 or the second substrate 300 when the first substrate 200 and the second substrate 300 is bent into a desired curved shape while the first substrate 200 or the second substrate is thinned.

Also, the first substrate 200 may include a first multi-etched region 260 surrounded by the first non-etched region 252 and the first single-etched regions 251, 253, and 254, and the second substrate 300 may include a second multi-etched region 360 surrounded by the second non-etched region 352 and the second single-etched regions 351, 353, and 354.

The first non-etched region 252 on one side in the first direction DR1 may be disposed not to overlap, in the thickness direction, the second non-etched region 352 on one side in the first direction DR1, and the first multi-etched region 260 may be disposed not to overlap, in the thickness direction, the second multi-etched region 360 and the second non-etched region 352 on one side in the first direction DR1. The width W2 of the first non-etched region 252 may be smaller than the width W1 of the second non-etched region 352. For example, the width W2 of the first non-etched region 252 may be smaller than or equal to twice the width W1 of the second non-etched region 352, but the present invention is not limited thereto.

The first single-etched region 251 on the other side in the first direction DR1 may be disposed to overlap, in the thickness direction, the second single-etched region 351 on the other side in the first direction DR1. The width W3 of the first single-etched region 251 may be equal to the width W3 of the second single-etched region 351, but the present invention is not limited thereto.

The first single-etched region 254 on one side in the second direction DR2 may be disposed to overlap, in the thickness direction, the second single-etched region 354 on one side in the second direction DR2, and the first single-etched region 253 on the other side in the second direction DR2 may be disposed to overlap, in the thickness direction, the second single-etched region 353 on the other side in the second direction DR2. The width W3 of the first single-etched region 254 at one side in the second direction DR2 may be equal to the width W3 of the second single-etched region 354 at one side in the second direction DR2, but the present invention is not limited thereto. All of the single-etched regions 251, 253, 254, 351, 353, and 354 are illustrated as having the same width, but the present invention is not limited thereto.

The first substrate 200 may include one surface 201b facing one surface 301b of the second substrate 300 and other surfaces 201a, 202a1, 202a2, 202a3, and 202a4 opposite to the one surface 201b, and the second substrate 300 may include one surface 301b facing the one surface 201b of the first substrate 200 and other surfaces 301a, 302a1, 302a2, 302a3, and 302a4 opposite to the one surface 301b. Although the cross-sectional shapes of the surfaces 201b and 301b of the first substrate 200 and the second substrate 300 are shown to be linear in the first direction DR1, a display device including the first substrate 200 and the second substrate 300 may be a curved display device, as described above, and thus may be bent with a predetermined curvature. The cross-sectional shapes of the surfaces 201b and 301b of the first substrate 200 and the second substrate 300 may be located over one curve (in the case of a curved display device), unlike the other surfaces 201a, 202a1, 202a2, 202a3, 202a4, 301a, 302a1, 302a2, 302a3, and 302a4 of the first substrate 200 and the second substrate 300. The other surfaces 201a, 202a1, 202a2, 202a3, 202a4, 301a, 302a1, 302a2, 302a3, and 302a4 of the first substrate 200 and the second substrate 300 include different regions in the thickness direction and thus may have a cross-sectional shape with an uneven surface. That is, the cross-sectional shapes of the other surfaces 201a, 202a1, 202a2, 202a3, 202a4, 301a, 302a1, 302a2, 302a3, and 302a4 of the first substrate 200 and the second substrate 300 may not be placed on the same curve (in the case of a curved display device).

The thickness t3 of the first non-etched region 252 of the first substrate 200 may be greater than the thickness t4 of the first single-etched regions 251, 253, and 254, and the thickness t4 of the first single-etched regions 251, 253, and 254 may be greater than the thickness t6 of the first multi-etched region 260. The thickness t1 of the second non-etched region 352 of the second substrate 300 may be greater than the thickness t2 of the second single-etched regions 351, 353, and 354, and the thickness t2 of the second single-etched regions 351, 353, and 354 may be greater than the thickness t5 of the second multi-etched region 360.

Specifically, the other surface 202a2 in the first non-etched region 252 of the first substrate 200 may protrude downward in the third direction DR3 farther than the other surfaces 202a1, 202a3, and 202a4 in the first single-etched regions 251, 253, and 254. In other words, the other surfaces 202a1, 202a3, and 202a4 in the first single-etched regions 251, 253, and 254 may be further depressed or recessed in the thickness direction DR3 than the other surface 202a2 in the first non-etched region 252. Also, the other surfaces 202a1, 202a3, and 202a4 in the first single-etched regions 251, 253, and 254 may protrude downward in the third direction DR3 farther than the other surface 201a in the first multi-etched region 260. In other words, the other surface 201a in the first multi-etched regions 260 may be further depressed or recessed in the thickness direction DR3 than the other surfaces 202a1, 202a3, and 202a4 in the first single-etched regions 251, 253, and 254.

Also, the other surface 302a2 in the second non-etched region 352 of the second substrate 300 may protrude upward in the third direction DR3 farther than the other surfaces 302a1, 302a3, and 302a4 in the second single-etched regions 351, 353, and 354. In other words, the other surfaces 302a1, 302a3, and 302a4 in the second single-etched regions 351, 353, and 354 may be further depressed or recessed in the thickness direction DR3 than the other surface 302a2 in the second non-etched region 352. Also, the other surfaces 302a1, 302a3, and 302a4 in the second single-etched regions 351, 353, and 354 may protrude upward in the third direction DR3 farther than the other surface 301a in the second multi-etched regions 360. In other words, the other surface 301a in the second multi-etched regions 360 may be further depressed or recessed in the thickness direction DR3 than the other surfaces 302a1, 302a3, and 302a4 in the second single-etched regions 351, 353, and 354.

Thus, the multi-etched regions 260 and 360 may be easily bent in the curving process due to their small thickness.

The first substrate 200 includes a side surface 204a2 included in the first non-etched region 252 on one side in the first direction DR1, a side surface 204a1 included in the first single-etched region 251 on the other side in the first direction DR1, a side surface 204a4 included in the first single-etched region 254 on one side in the second direction DR2, and a side surface 204a3 included in the first single-etched region 253 on the other side in the second direction DR2. The second substrate 300 may include a side surface 304a2 included in the second non-etched region 352 on one side in the first direction DR1, a side surface 304a1 included in the second single-etched region 351 on the other side in the first direction DR1, a side surface 304a4 included in the second single-etched region 354 on one side in the second direction DR2, and a side surface 304a3 included in the second single-etched region 353 on the other side in the second direction DR2.

The side surface 204a1 included in the first single-etched region 251 on the other side in the first direction DR1 and the side surface 304a1 included in the second single-etched region 351 on the other side in the first direction DR1 may be assigned in the thickness direction (the third direction DR3), the side surface 204a4 included in the first single-etched region 254 on one side in the second direction DR2 and the side surface 304a4 included in the second single-etched region 354 on one side in the second direction DR2 may be arranged in the thickness direction (the third direction DR3), and the side surface 204a3 included in the first single-etched region 253 on the other side in the second direction DR2 and the side surface 304a3 included in the second single-etched region 353 on the other side in the second direction DR2 may be arranged in the thickness direction (the third direction DR3). On the other hand, as described above, the first non-etched region 252 on one side in the first direction DR1 may not be disposed to overlap, in the thickness direction, the second non-etched region 352 on one side in the first direction DR1 and may be disposed outside in the first direction DR1 as shown in FIGS. 2 and 3. That is, the side surface 204a2 included in the first non-etched region 252 on one side in the first direction DR1 may be located more outside in the first direction DR1 than the side surface 304a2 included in the second non-etched region 352 on one side in the first direction DR1.

The first substrate 200 and the second substrate 300 may include the multi-etched regions 260 and 360, the plurality of non-etched regions 252 and 352, and connection surfaces 203a1, 203a2, 203a3, 203a4, 303a1, 303a2, 303a3, and 303a4 between the multi-etched regions 260 and 360 and the plurality of single-etched regions 251, 253, 254, 351, 353, and 354. The first substrate 200 and the second substrate 300 may include the connection surfaces 203a1, 203a2, 203a3, 203a4, 303a1, 303a2, 303a3, and 303a4. With respect to the surfaces 201a and 301a of the multi-etched regions 260 and 360, an inclined surface having a right angle or an obtuse angle may be formed.

A liquid crystal layer 500 may be disposed between one surface 201b of the first substrate 200 and one surface 301b of the second substrate 300. Also, a sealing member 110 is disposed between the first substrate 200 and the second substrate 300. The sealing member 110 may be formed along the edges of the second substrate 300 and between the first substrate 200 and the second substrate 300 and may be disposed to overlap the non-etched regions 260 and 360 and the single-etched regions 251, 253, 254, 351, 353, and 354.

In the display device according to an embodiment, by arranging the first non-etched region 252 of the first substrate 200 and the second non-etched region 352 of the second substrate 300 so that the regions do not overlap, the thicknesses of the protruding regions of the first substrate 200 and the second substrate 300 may be made uniform as a whole. That is, the first non-etched region 252 that has the largest thickness in the first substrate 200 may be located on one side of the cross-sectional shape (FIGS. 2 to 4) of the display device in the first direction DR1, the second non-etched region 352 that is adjacent to and does not overlaps the first non-etched region 352 and that has the largest thickness in the second substrate 300 may be located on one side in the first direction DR1, the single-etched regions 251 and 351 that are thinner than the non-etched regions 252 and 352 and that are thicker than the multi-etched regions 260 and 360 may be located on the other side in the first direction DR1, the single-etched regions 254 and 354 that are thinner than the non-etched regions 252 and 352 and that are thicker than the multi-etched regions 260 and 360 may be located on one side in the second direction DR2, and the single-etched regions 253 and 353 that are thinner than the non-etched regions 252 and 352 and that are thicker than the multi-etched regions 260 and 360 may be located on the other side in the second direction DR2.

By making the thickness of the protruding region of the curved display device uniform as a whole, it is possible to prevent physical damage or cracks in some regions because stress due to a curved surface or bending is not different for each region even if the first substrate 200 and the second substrate 300 have a curved shape.

A fabrication method of the display device according to an embodiment will be described below. In the following embodiments, descriptions of the same components as those of the previous embodiments will be omitted or simplified, and differences will be mainly described.

Figure 5:
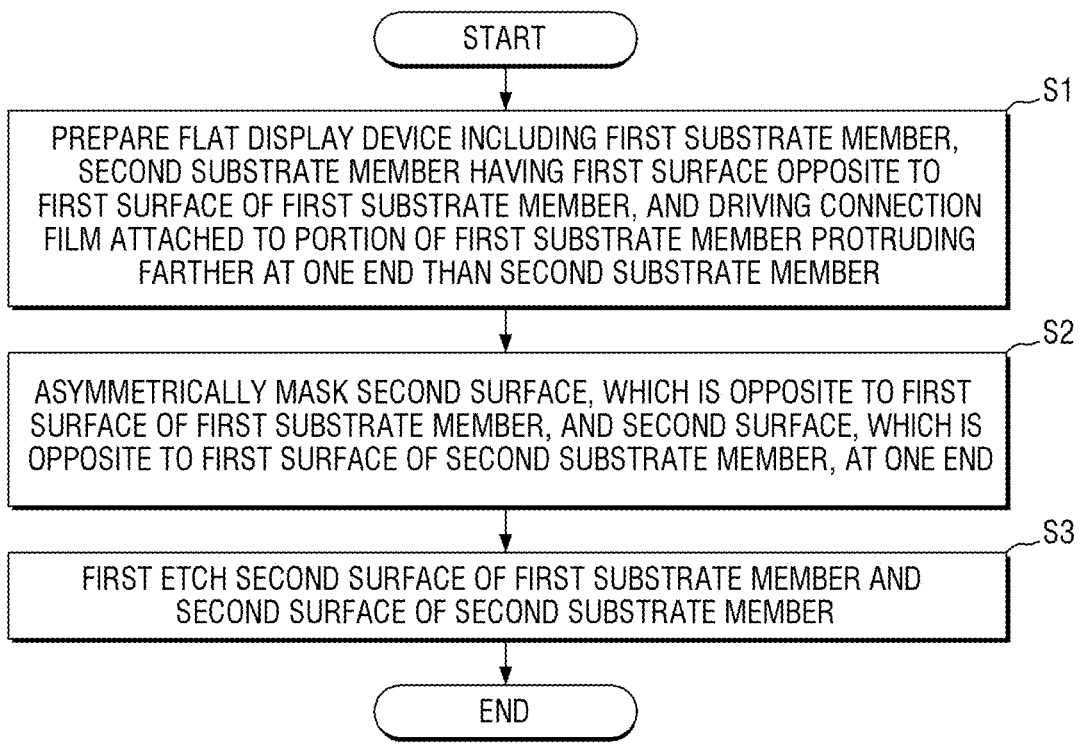
FIG. 5 is a flowchart of a fabrication method of the display device according to an embodiment.
Figure 6:
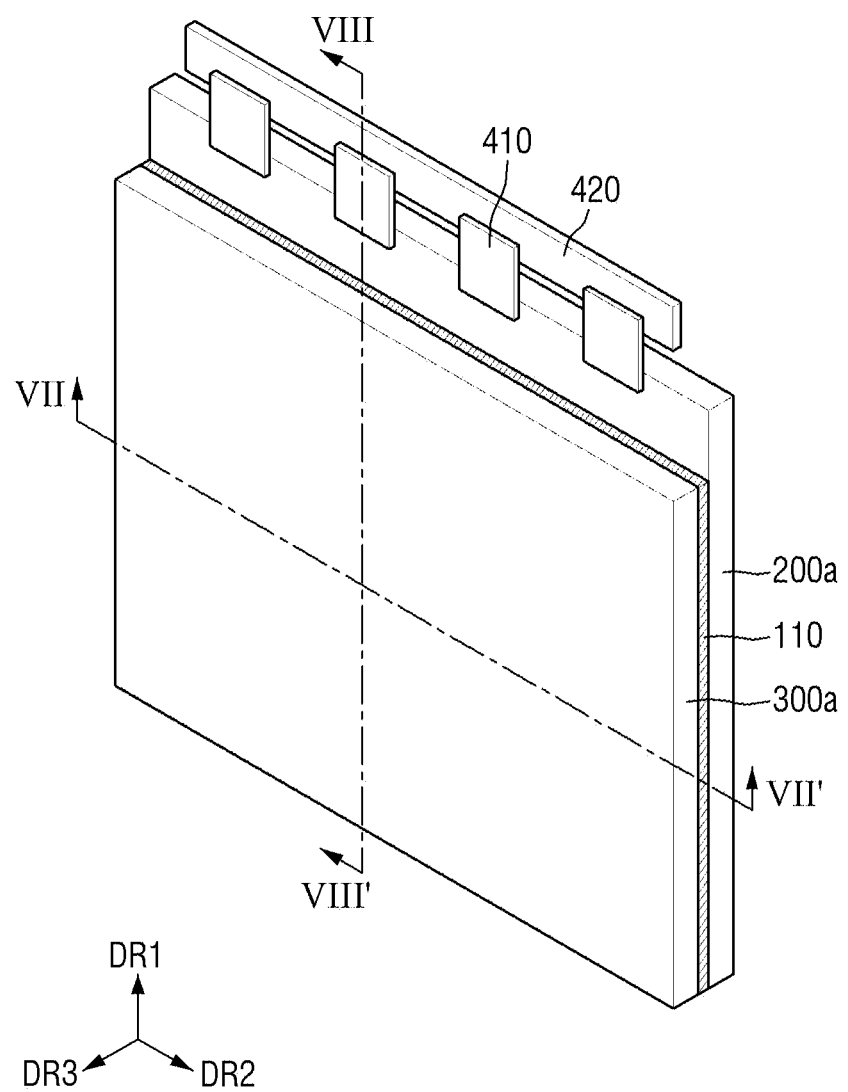
FIGS. 6, 9, and 11 are perspective views sequentially illustrating a portion of the fabrication process of the display device.
Figure 7:
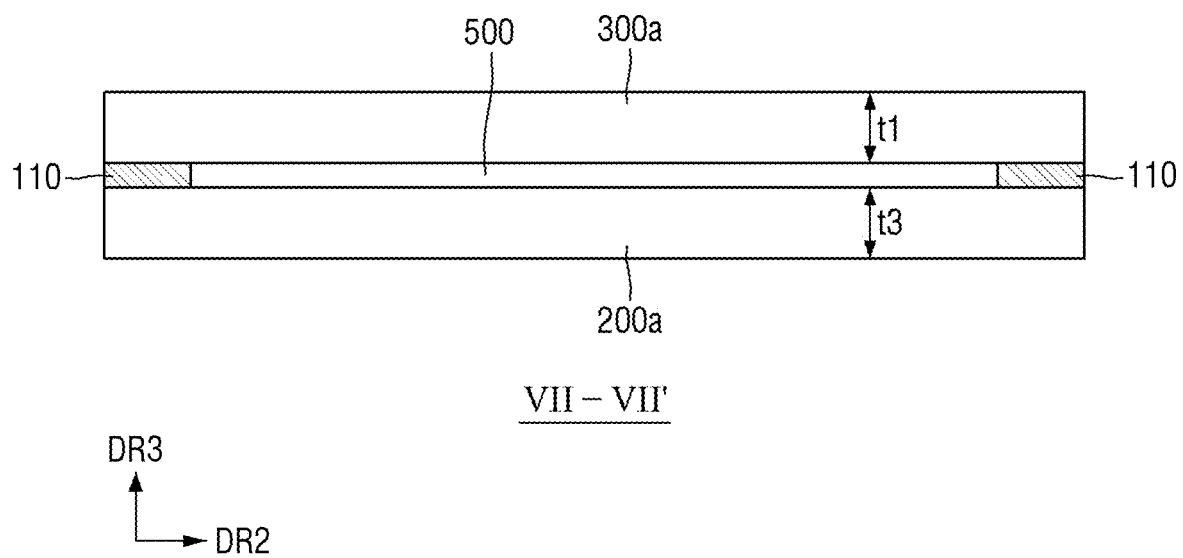
FIG. 7 is a cross-sectional view taken along line VII-VII' of FIG. 6.
Figure 8:
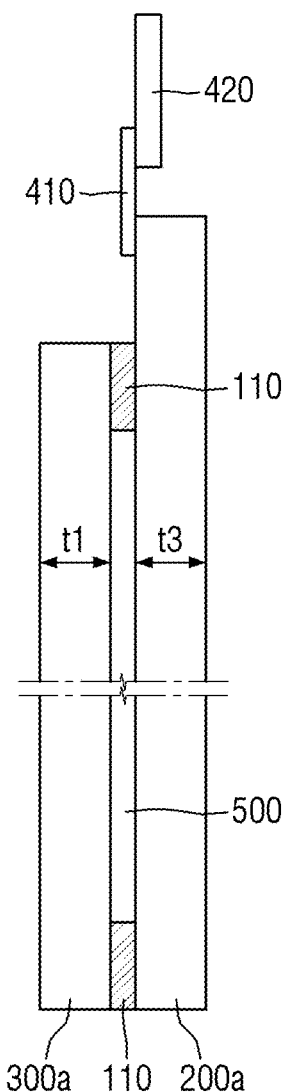
FIG. 8 is a cross-sectional view taken along line VIII-VIII' of FIG. 6.
Figure 8:
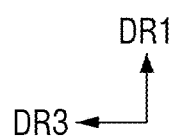
Figure 9:
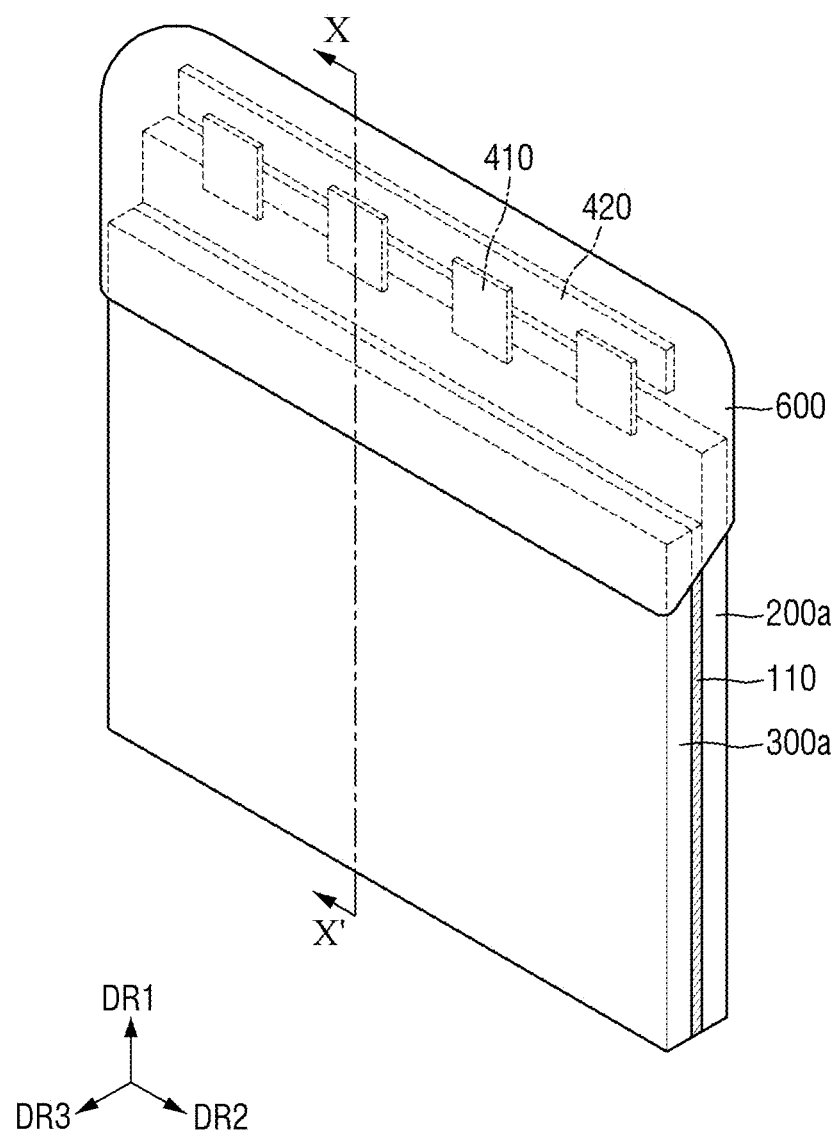
Figure 10:
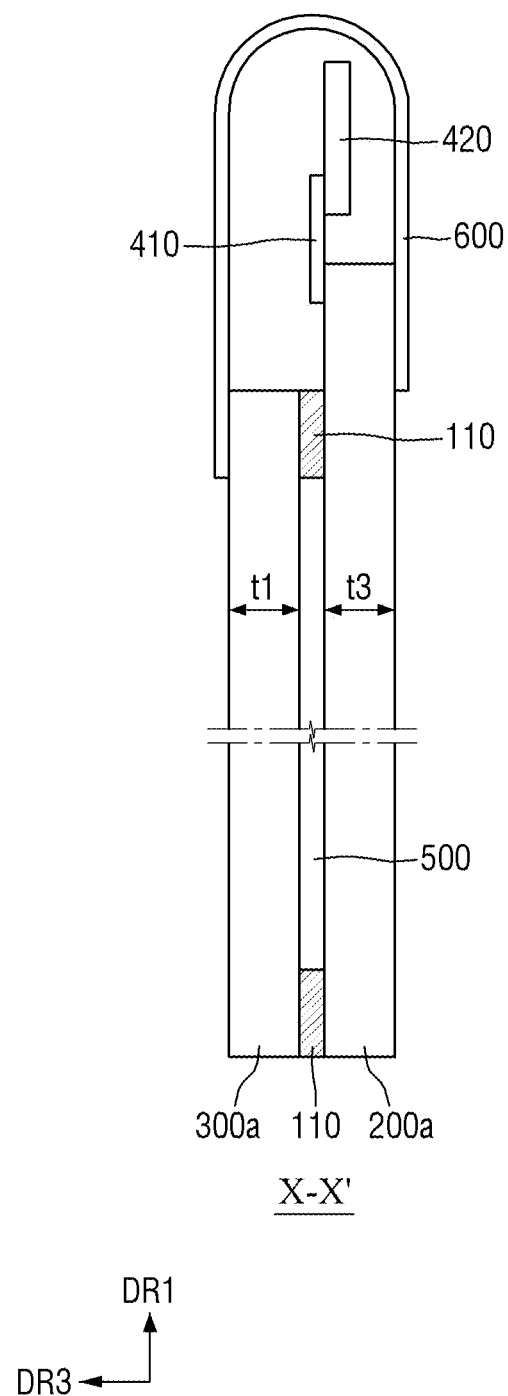
FIG. 10 is a cross-sectional view taken along line X-X' of FIG. 9.
Figure 11:
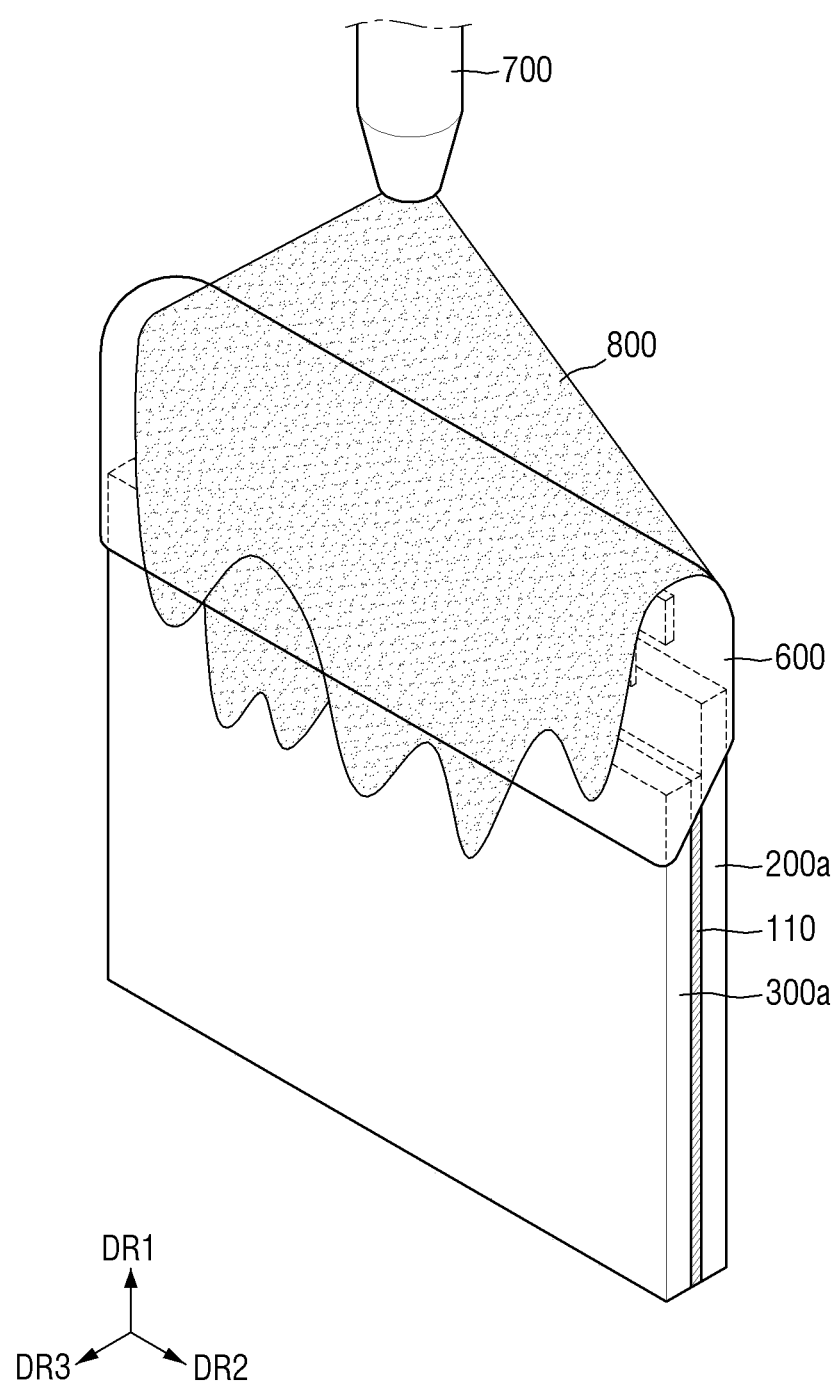

FIG. 5 is a flowchart of a fabrication method of the display device according to an embodiment, FIGS. 6, 9, and 11 are perspective views sequentially illustrating a portion of the fabrication process of the display device, FIG. 7 is a cross-sectional view taken along line VII-VII' of FIG. 6. FIG. 8 is a cross-sectional view taken along line VIII-VIII' of FIG. 6, FIG. 10 is a cross-sectional view taken along line X-X' of FIG. 9, and FIGS. 12 to 17 are perspective views sequentially illustrating a portion of the fabrication process of the display device.

Referring to FIGS. 5 to 8, first, a flat display device including a first substrate member 200a, a second substrate member 300a having a first surface opposite to a first surface of the first substrate member 200a, a driving connection film 410 attached to a portion of the first substrate member 200a that is placed at one end to protrude farther than the second substrate member 300a, and a driving circuit board 420 connected to the driving connection film 410 is prepared (S1).

The first substrate member 200a and the second substrate member 300a correspond to the first substrate 200 and the second substrate 300, respectively, in the display device according to an embodiment. The first substrate member 200a and the second substrate member 300a refer to a substrate member before first etching and a substrate member before second etching, respectively.

The first surface of the first substrate member 200a may correspond to one surface 201b of the first substrate 200, and the first surface of the second substrate member 300a may correspond to one surface 301b of the second substrate 300.

The portion of the first substrate member 200a that protrudes farther than the second substrate member 300a may correspond to one end of the first substrate 200 in the first direction DR1.

As shown in FIG. 7, the first substrate member 200a may have a third thickness t3, and the second substrate member 300a may have a first thickness t1.

Since the first substrate member 200a, the second substrate member 300a, the sealing member 110, and the liquid crystal layer 500 have been described above, redundant description thereof will be omitted.

Next, referring to FIGS. 5, 9, and 10, a second surface opposite to the first surface of the first substrate member 200a and a second surface opposite to the first surface of the second substrate member 300a are asymmetrically masked at the one end (S2). The masking operation S2 is performed before an etching process. The masking operation S2 refers to first masking.

A masking member 600, which is used for masking, may be formed in the shape of an envelope with one open end and may be installed to cover portions that are to form non-etched regions 252 and 352 (see FIGS. 2 and 3). As another example, the masking member 600 may be formed in a film form and may be installed by wrapping, over an edge, a portion that is to form a second non-etched region 352 (see FIGS. 2 and 3) in one surface (the second surface of the second substrate member 300a) of the flat display device to a portion that is to form a first non-etched region 252 (see FIGS. 2 and 3) in the other surface (the second surface of the first substrate member 200a) of the flat display device. At this time, when the driving connection film 410 is attached to an edge portion where the masking member 600 is to be installed, the driving connection film 410 may cover the edge portion or may also be attached over.

An acid-resistant adhesive tape (not shown) may be installed on the edge of the masking member 600 to easily attach the masking member 600 to the outer surface of the flat panel display device. When the masking member 600 is formed in a film form and attached over, both ends of the masking member 600 are attached by an acid-resistant adhesive tape or by thermal sealing in order to prevent the penetration of etchant. The masking member 600 itself may be made of an adhesive tape.

In the display device according to an embodiment, the first non-etched region 252 of the first substrate 200 may be located more outside in the first direction DR1 than the second non-etched region 352 of the second substrate 300, and the first non-etched region 252 and the second non-etched region 352 may be disposed not to overlap each other in the thickness direction. To form this, in the masking operation S2 of the fabrication process of the display device, the masking member 600 is asymmetrically disposed. That is, as shown in FIG. 10, the length of the masking member 600 covering the second substrate member 300a in the first direction DR1 is the length of the masking member 600 covering the first substrate member 200a in the first direction DR1. That is, the masking member 600 may be disposed such that an end of the masking member 600 covering the second substrate member 300a protrudes to the other side in the first direction DR1 farther than an end of the masking member 600 covering the first substrate member 200a.

Accordingly, a cross-sectional shape of one side, in the first direction DR1, of the display device according to an embodiment shown in FIG. 2 may be fabricated.

Subsequently, referring to FIGS. 11 to 13, the second surface of the first substrate member 200a and the second surface of the second substrate member 300a are first etched S3.

In the masking operation S2, the masking member 600 covers portions that are to form the non-etched regions 252 and 352 (see FIGS. 2 and 3) and exposes the single-etched regions 251, 253, 254, 351, 353, and 354 (see FIGS. 2 to 4) and the multi-etched regions 260 and 360 (see FIGS. 2 to 4). Thus, the exposed single-etched regions 251, 253, 254, 351, 353, and 354 (see FIGS. 2 to 4) and the exposed multi-etched regions 260 and 360 (see FIGS. 2 to 4) are first etched by etchant.

Figure 12:
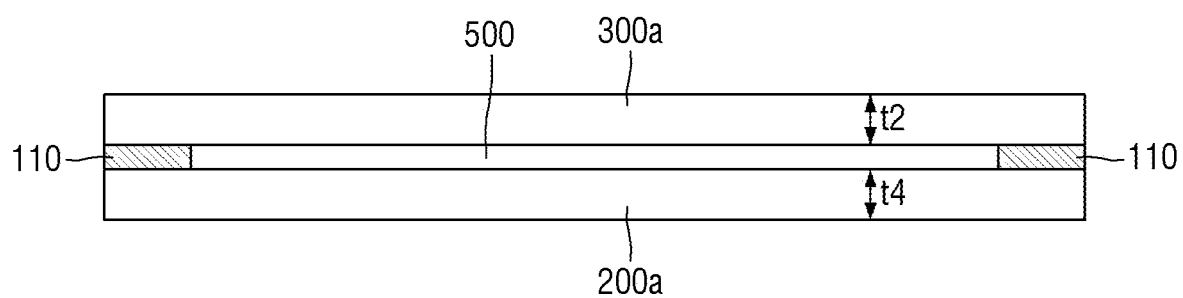
FIGS. 12 to 17 are perspective views sequentially illustrating a portion of the fabrication process of the display device.
Figure 12:
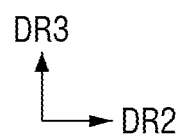
Figure 13:
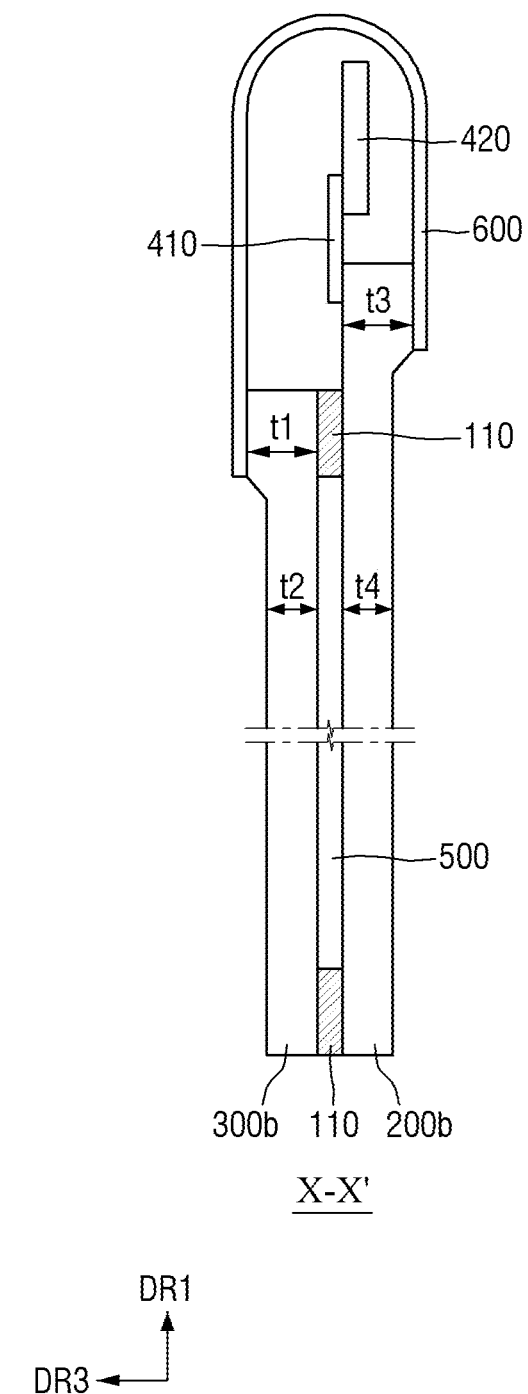

As a result, in the first substrate member 200b and the second substrate member 300b, as shown in FIG. 12, the non-etched regions 252 and 352 (see FIGS. 2 and 3) covered by the masking member 600 maintain the above-described thicknesses t1 and t3, respectively, but the single-etched regions 251, 253, 254, 351, 353, and 354 (see FIGS. 2 to 4) and the multi-etched regions 260 and 360 (see FIGS. 2 to 4) that are not covered by the masking member 600 but exposed may have reduced thicknesses. For example, the exposed portion of the first substrate member 200b may have a fourth thickness t4 smaller than the third thickness t3, and the exposed portion of the second substrate member 300b may have a second thickness t2 smaller than the first thickness t1.

Subsequently, referring to FIGS. 14 and 15, second masking is performed.

The second masking operation includes an operation of masking the second surfaces of regions that are to form the single-etched regions 251, 253, 254, 351, 353, and 354 (see FIGS. 2 to 4) of the first substrate member 200b and the second substrate member 300b. Like the above-described masking operation, the second masking may be performed using the masking member 600a. The masking member 600a used for the second masking may have substantially the same material and function as the masking member used for the first masking.

Figure 14:
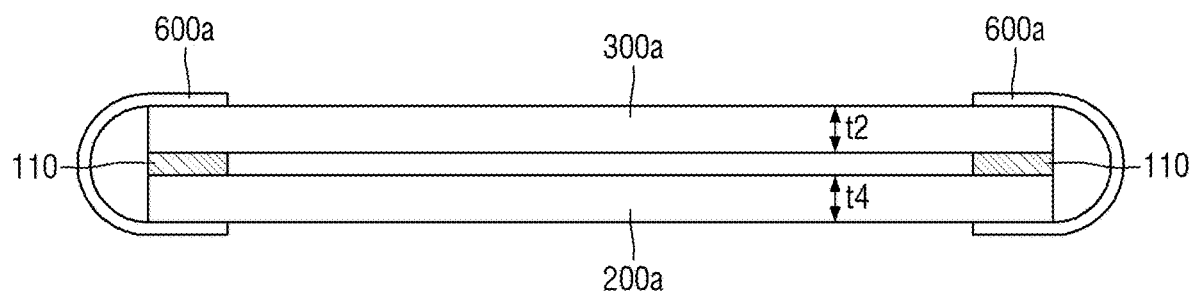
Figure 15:
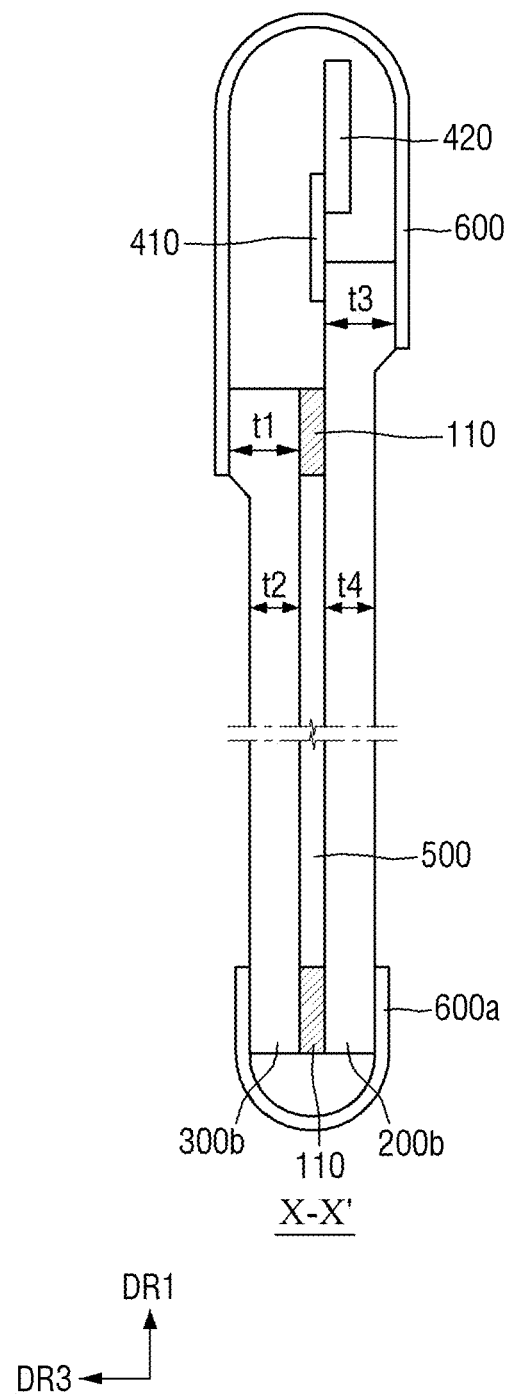

In the second masking operation, as shown in FIGS. 14 and 15, the length of the masking member 600a covering the second substrate member 300b in the first direction DR1 may be the same as the length of the masking member 600b covering the first substrate member 200b in the first direction DR1. Likewise, the length of the masking member 600a covering the second substrate member 300b in the second direction DR2 may be the same as the length of the masking member 600b covering the first substrate member 200b in the second direction DR2.

In the second masking operation, the masking member 600 used in the first masking may cover the non-etched regions 252 and 352 (see FIGS. 2 and 3) as it is.

Subsequently, referring to FIGS. 16 to 17, the second surface of the first substrate member 200b and the second surface of the second substrate member 300b are second etched.

In the second etching operation, the masking members 600 and 600a cover portions that are to form the non-etched regions 252 and 352 (see FIGS. 2 and 3) and the single-etched regions 251, 253, 254, 351, 353, and 354 (see FIGS. 2 to 4) and expose the multi-etched regions 260 and 360 (see FIGS. 2 to 4). Thus, the exposed multi-etched regions 260 and 360 (see FIGS. 2 to 4) are second etched by etchant.

Figure 16:
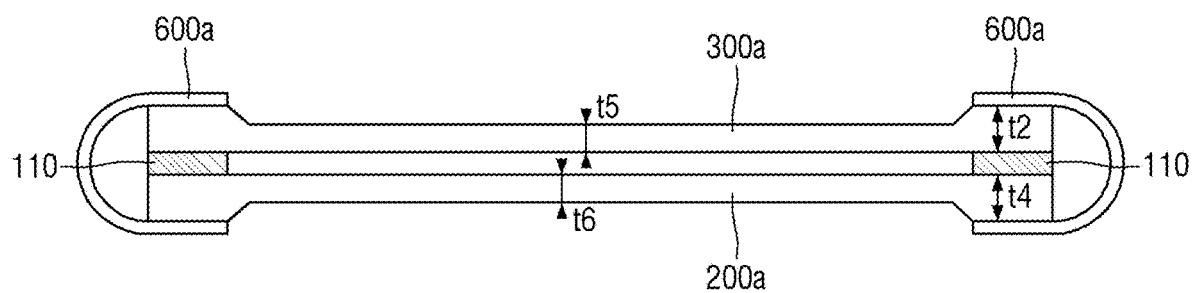
Figure 17:
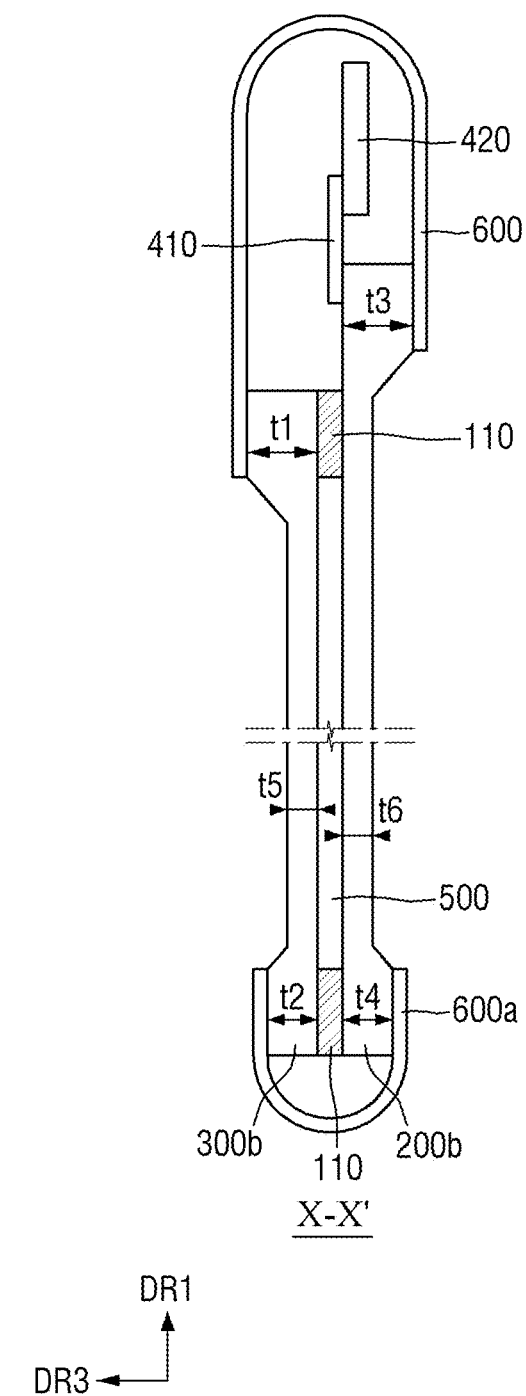

As a result, in the first substrate member 200c and the second substrate member 300c, as shown in FIGS. 16 and 17, the non-etched regions 252 and 352 (see FIGS. 2 and 3) covered by the masking member 600 formed in the first masking operation S2 maintain the above-described thicknesses t1 and t3, respectively, and the single-etched regions 251, 253, 254, 351, 353, and 354 (see FIGS. 2 to 4) covered by the masking member 600a formed in the second masking operation maintain the above-described thicknesses t2 and t4. However, the multi-etched regions 260 and 360 (see FIGS. 2 to 4) that are not covered by the masking members 600 and 600a but exposed may have reduced thicknesses. For example, the exposed portion of the first substrate member 200c may have a sixth thickness t6 smaller than the fourth thickness t4, and the exposed portion of the second substrate member 300c may have a fifth thickness t5 smaller than the second thickness t2.

With the fabrication method of the display device according to this embodiment, by asymmetrically forming the masking member 600 on the substrate members 200 and 300 in the first masking operation S2, it is possible to asymmetrically form the non-etched regions 252 and 352 (see FIGS. 2 and 3) of the substrate members 200 and 300. That is, the non-etched regions 252 and 352 (see FIGS. 2 and 3) of the substrate members 200 and 300 may be arranged so as not to overlap each other in the thickness direction. Thus, as described above, by making the thickness of the protruding region of the curved display device uniform as a whole, it is possible to prevent physical damage or cracks in some regions because stress due to a curved surface or bending is not different for each region even if the first substrate 200 and the second substrate 300 have a curved shape.

Although the example embodiments of the present invention have been described with reference to the accompanying drawings, those skilled in the art will appreciate that various modifications and alterations may be made therein without departing from the spirit or essential feature of the present invention. Therefore, the above embodiments are to be regarded as illustrative rather than restrictive.

DESCRIPTION OF REFERENCE NUMERALS

110: Sealing member
200: First substrate
300: Second substrate
410: Driving connection film
420: Driving circuit board
500: Liquid crystal layer
600: Masking member

The invention claimed is:

1. A display device comprising:
a first substrate; and
a second substrate including one surface opposite to one surface of the first substrate,
wherein
the first substrate comprises a first-one portion that overlaps the second substrate in a thickness direction and a first-two portion that does not overlap the second substrate,
the second substrate comprises a second portion that overlaps the first substrate in the thickness direction,
the first-two portion has a greater thickness than the first-one portion,
the second portion comprises a second-one portion that overlaps the first-one portion in the thickness direction and a second-two portion disposed between the second-one portion and the first-two portion in a plan view,
the second-two portion has a greater thickness than the second-one portion,
the second-two portion is disposed so as not to overlap the first-two portion in the thickness direction,
wherein the first-one portion comprises a first-one-one portion and a first-one-two portion disposed between the first-one-one portion and the first-two portion, and the first-one-one portion has a greater thickness than the first-one-two portion,
wherein the second-one portion comprises a second-one-one portion disposed to overlap the first-one-one portion in the thickness direction and a second-one-two portion disposed to overlap the first-one-two portion in the thickness direction, and the second-one-one portion has a greater thickness than the second-one-two portion,
wherein the first-one-one portion has a smaller thickness than the first-two portion and the second-one-one portion has a smaller thickness than the second-two portion, and
wherein the first-one-two portion and the second-one-two portion are multi-etched regions, the first-one-one portion and the second-one-one portion are single-etched regions, and the first-two portion and the second-two portion are non-etched regions.

2. The display device of claim 1, wherein the width of the first-one-one portion toward the first-one-two portion is the same as the width of the second-one-one portion toward the second-one-two portion.

3. The display device of claim 1, wherein the width of the first-two portion toward the first-one portion is smaller than the width of the second-two portion toward the first-one portion.

4. The display device of claim 1, wherein the first substrate and the second substrate include curved surfaces obtained by bending the first-one portion and the second-one portion, respectively.

5. The display device of claim 1, further comprising a driving connection film attached to the first-two portion of the first substrate.

6. The display device of claim 5, further comprising a driving circuit board connected to the driving connection film.

7. A fabrication method of a display device, the fabrication method comprising operations of:
- preparing a flat display device including a first substrate member, a second substrate member having one surface opposite to one surface of the first substrate member, and a driving connection film attached to a part of the first substrate member protruding at one end farther than the second substrate member;
- asymmetrically masking, at one end, the other surface, which is opposite to the one surface of the first substrate member, and the other surface, which is opposite to the one surface of the second substrate member; and
- first etching the other surface of the first substrate member and the other surface of the second substrate member,
- wherein in the operation of asymmetrically masking, at one end, the other surface, which is opposite to the one surface of the first substrate member, and the other surface, which is opposite to the one surface of the second substrate member, the length of the masked surface of the first substrate member is smaller than the length of the masked surface of the second substrate member, and
- wherein after the operation of first etching the other surface of the first substrate member and the other surface of the second substrate member, the fabrication method further comprises an operation of masking the other surface of the first substrate member and the other surface of the second substrate member at the other end facing the one end.

8. The fabrication method of claim 7, wherein in the operation of masking the other surface of the first substrate member and the other surface of the second substrate member at the other end facing the one end, the length of the masked surface of the first substrate member is the same as the length of the masked surface of the second substrate member.

* * * * *